United States Patent
Subramanian et al.

(10) Patent No.: US 6,656,830 B1
(45) Date of Patent: Dec. 2, 2003

(54) DUAL DAMASCENE WITH SILICON CARBIDE MIDDLE ETCH STOP LAYER/ARC

(75) Inventors: Ramkumar Subramanian, San Jose, CA (US); Dawn M. Hopper, San Jose, CA (US); Fei Wang, San Jose, CA (US); Lynne A. Okada, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 150 days.

(21) Appl. No.: 09/777,695

(22) Filed: Feb. 7, 2001

(51) Int. Cl.$^7$ .......................................... H01L 21/4763
(52) U.S. Cl. ...................... 438/618; 438/622; 438/638; 438/687
(58) Field of Search ................................ 438/618, 622, 438/638, 687; 257/437, 448, 751, 758

(56) References Cited

U.S. PATENT DOCUMENTS

| | | | |
|---|---|---|---|
| 5,040,619 A | 8/1991 | Jordan et al. | |
| 6,040,243 A | * 3/2000 | Li et al. | 438/687 |
| 6,107,204 A | 8/2000 | Yu et al. | |
| 6,114,233 A | 9/2000 | Yeh | |
| 6,313,028 B2 | * 11/2001 | Huang et al. | 438/637 |
| 6,331,479 B1 | * 12/2001 | Li et al. | 438/618 |
| 6,380,084 B1 | * 4/2002 | Lim et al. | 438/687 |
| 6,465,358 B1 | * 10/2002 | Nashner et al. | 438/700 |

OTHER PUBLICATIONS

S. Wolf, "Silicon Processing for the VLSI Era: vol. 2," Lattice Press, Sunset Beach, CA, (1990), pp. 697–711.*

* cited by examiner

Primary Examiner—Tom Thomas
Assistant Examiner—Thomas Magee
(74) Attorney, Agent, or Firm—McDermott, Will & Emery

(57) ABSTRACT

The dimensional accuracy of trench formation and, hence, metal line width, in damascene processing is improved by employing a silicon carbide middle etch stop layer/ARC. Embodiments include via first-trench last dual damascene techniques employing a silicon carbide middle etch stop layer/ARC having an extinction coefficient (k) of about –0.10 to about –0.60.

10 Claims, 3 Drawing Sheets

US 6,656,830 B1

DUAL DAMASCENE WITH SILICON CARBIDE MIDDLE ETCH STOP LAYER/ARC

TECHNICAL FIELD

The present invention relates to semiconductor devices having accurately dimensioned interconnection patterns. The present invention is particularly applicable to ultra large-scale integrated circuit (ULSI) devices having features in the deep sub-micron regime.

BACKGROUND ART

As integrated circuit geometries continue to plunge into the deep sub-micron regime, it has become increasingly difficult to satisfy the requirements for dimensional accuracy, particularly in integration technology which is considered one of the most demanding aspects of fabricating ULSI devices. Demands for ULSI semiconductor wiring require increasingly denser arrays with minimal spacings between narrower conductive lines. Implementation becomes problematic in manufacturing semiconductor devices having a design rule of about 0.12 micron and under.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different levels, i.e., upper and lower levels, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as feature sizes shrink into the deep sub-micron regime.

A conductive plug filling a via hole is typically formed by depositing an interlayer dielectric (ILD) on a patterned conductive layer comprising at least one conductive feature, forming an opening through the ILD by conventional photolithographic and etching techniques, and filling the opening with a conductive material. The excess conductive material or overburden on the surface of the ILD is typically removed by chemical-mechanical polishing (CMP). One such method is known as damascene and basically involves forming an opening in the ILD and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-a-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium nitride (TiN), titanium-tungsten (TiW), Tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

Cu interconnect technology, by and large, has been implemented employing damascene techniques, wherein a first dielectric layer, such as a silicon oxide layer, e.g., derived from tetraethyl orthosilicate (TEOS) or silane, or a low dielectric constant material, i.e., a material having a dielectric constant of no greater than 4 (with a dielectric constant of 1 representing a vacuum), is formed over an underlying pattern having a capping layer thereon, e.g., a Cu or Cu alloy pattern with a silicon nitride capping layer. A barrier layer and optional seedlayer are then deposited, followed by Cu deposition, as by electrodeposition or electroless deposition.

In implementing conventional damascene techniques an organic bottom anti-reflective coating (BARC) is typically deposited over the underlying capped metal feature. In implementing dual damascene techniques wherein the via is formed before forming the trench (via first-trench last), a middle etch stop layer, such as silicon nitride or silicon oxynitride, is deposited on the first dielectric layer. A second dielectric layer is then deposited on the middle etch stop layer. The etch stop layer is chosen for its high selectivity with respect to the overlying second dielectric layer. A photoresist mask is then formed over the second dielectric layer, and anisotropic etching is conducted to form a via opening through the second dielectric layer, middle etch stop layer and first dielectric layer. Subsequently, the photoresist mask for the via opening is removed and a photoresist mask for a trench is formed overlying the second dielectric layer. The second photoresist mask is typically formed at a thickness of about 4,000 Å to about 6,000 Å, which is undesirably large yielding less accurate patterning than a relatively thinner photoresist mask. However, such a large thickness is required due to photoresist consumption during patterning and etching, because of the relatively poor ability of the middle etch stop layer, e.g., silicon oxynitride, to also function as an anti-reflective coating (ARC) Anisotropic etching is then conducted to form a trench, having a width greater than the diameter or cross sectional width of the via hole, stopping on the middle etch stop layer.

As miniaturization proceeds apace with an attendant shrinkage in the size of metal lines, e.g., metal lines having a width of about 0.3 micron and under, e.g., about 0.2 micron and under, it becomes increasingly difficult to maintain the dimensional accuracy of the metal lines, particularly when implementing dual damascene techniques. Accordingly, there exists a need for interconnection methodology enabling the formation of metal features, such as metal lines, with high dimensional accuracy. There exists a particular need for dual damascene methodology enabling the formation of accurately dimensional metal lines having a width of about 0.3 micron and under, e.g., about 0.2 micron and under.

SUMMARY OF THE INVENTION

An advantage of the present invention is a semiconductor device comprising an interconnection pattern with high dimensional accuracy.

Another advantage of the present invention is a method of manufacturing a semiconductor device comprising an interconnection pattern with accurately dimensioned metal lines.

Additional advantages and features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a first dielectric layer on a capping layer overlying a lower metal feature of a lower metal level; forming a silicon carbide etch stop layer/anti-reflective coating (ARC) on the first dielectric layer; forming a second dielectric layer on the silicon carbide etch stop layer/ARC; and etching to form an opening, having a cross sectional width, through the second dielectric layer, through the silicon carbide etch stop layer/ARC and through the first dielectric layer exposing a portion of the capping layer.

Embodiments of the present invention comprise forming a photoresist mask on the second dielectric layer at a thickness of about 2,500 Å to about 3,500 Å, e.g., about 3,000 Å, and etching to form a trench having a width greater than the cross sectional width of the first opening through the second dielectric layer stopping on the silicon carbide etch stop layer/ARC, and etching through the exposed portion of the underlying capping layer, e.g., silicon nitride, exposing a portion of the lower metal feature. Embodiments of the present invention further include chemical vapor depositing silicon carbide having an extinction coefficient (k) of about −0.10 to about −0.60, as the middle etch stop layer/ARC. After depositing a suitable barrier metal layer and seedlayer, Cu or Cu alloy is then deposited, as by electrodeposition or electroless deposition. CMP is then conducted followed by deposition of a suitable capping layer, such as silicon nitride. As employed throughout this disclosure, the symbol Cu is intended to encompass high purity elemental copper as well as Cu-based alloys, such as Cu alloys containing minor amounts of tin, zinc, manganese, titanium, germanium, zirconium, strontium, palladium, magnesium, chromium and tantalum.

Another aspect of the present invention is a semiconductor device comprising an interconnection pattern comprising: a lower metal level comprising a lower metal feature with a capping layer thereon; a first dielectric layer on the capping layer; a silicon carbide etch stop layer/ARC on the first dielectric layer; a second dielectric layer on the silicon carbide etch stop layer/ARC; and a dual damascene structure comprising: a metal line, such as Cu or a Cu alloy, in the second dielectric layer and on a portion of the silicon carbide etch stop layer/ARC; and a via in the first dielectric layer, wherein the via is in electrical contact with the lower part of the metal line and in electrical contact with an upper part of the lower metal feature.

Embodiments of the present invention comprise a semiconductor device with a middle silicon carbide etch stop layer/ARC having an extinction coefficient (k) of about −0.10 to about −0.60 and a thickness of about 200 Å to about 800 Å.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and descriptions are to regarding as illustrative in nature and not as restrictive.

BRIEF DESCRIPTION OF THE DRAWINGS

In FIGS. 1 through 3, similar features are denoted by similar reference numerals.

DESCRIPTION OF THE INVENTION

Figure 1:
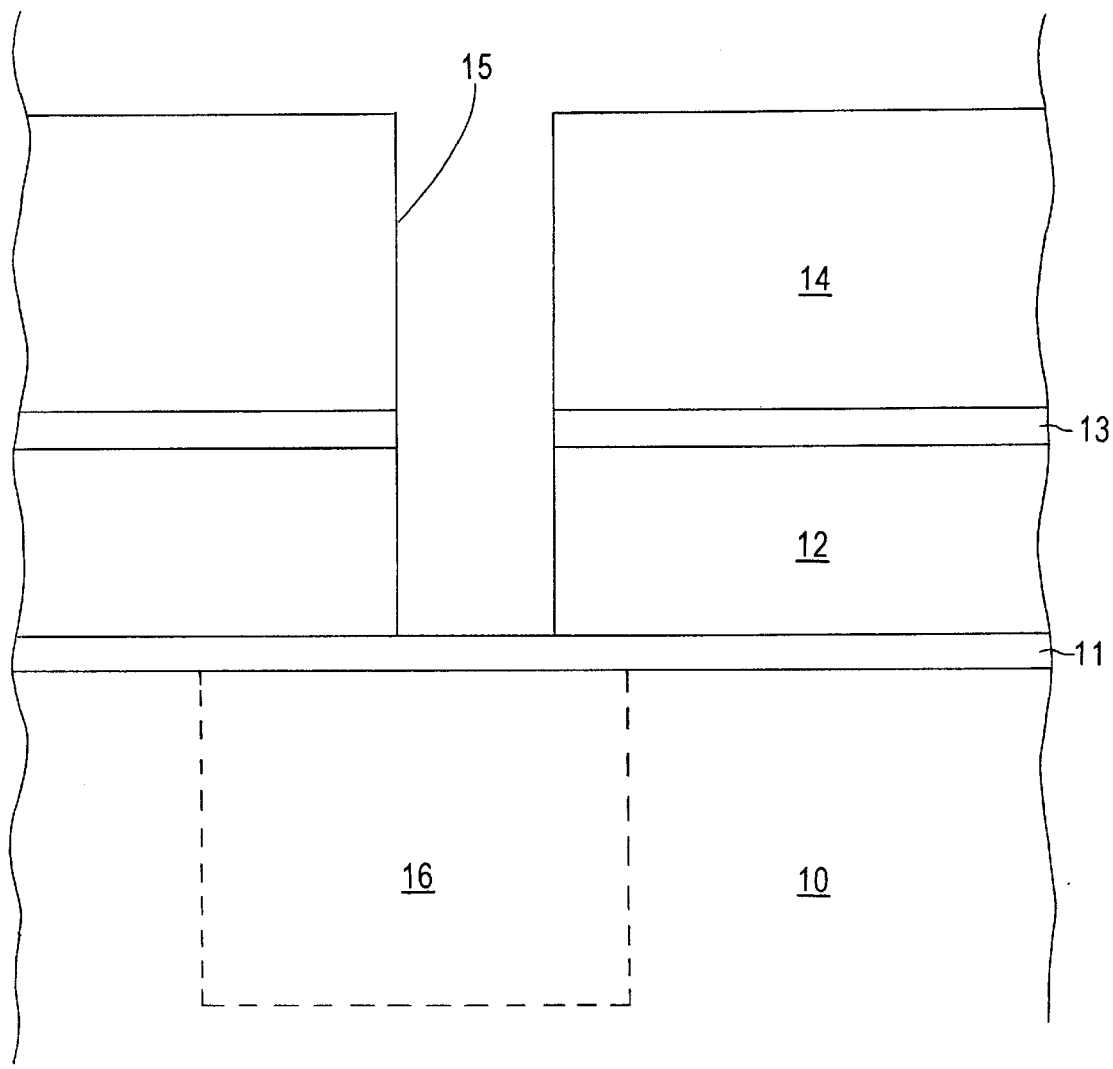
FIGS. 1 through 3 schematically illustrate sequential phases of a method in accordance with an embodiment of the present invention, with FIG. 3 schematically illustrating the resulting interconnection pattern.

The present invention enables the formation of semiconductor devices having interconnection patterns with improved dimensional accuracy, such as accurately dimensioned metal lines, e.g., Cu lines, having a width of about 0.3 micron and under, e.g., about 0.2 micron and under. This objective is achieved by the strategic use of silicon carbide as a combined middle etch stop layer and ARC in implementing dual damascene processing, particularly via-first trench-lost techniques Silicon oxynitride, conventionally employed as a middle etch stop layer in dual damascene techniques, typically has an extinction coefficient (k) of about −0.7 to about −1.1, e.g., about −1.1. In accordance with conventional practices, the silicon oxynitride etch stop layer exhibits high etch selectivity with respect to the overlying dielectric layer, such as a silicon oxide layer, e.g., silicon oxide derived from TEOS or silane. However, silicon oxynitride does not exhibit the antireflective properties necessary to achieve high dimensional accuracy in patterning metal lines, particularly metal lines having a width of about 0.3 micron and under, e.g., about 0.2 micron and under. In addition, due to the less than desirable anti-reflective properties of the conventional silicon oxynitride middle etch stop layer, a portion of the photoresist mask employed during patterning to form the trench opening is consumed. Consequently, the use of silicon oxynitride as a middle etch stop layer requires the use of a considerably thick photoresist mask, e.g., a photoresist mask having a thickness of about 4,000 Å to about 6,000 Å, which further reduces the dimensional accuracy of the resulting metal line. This problem becomes particularly acute as design requirements for the width of the metal line plunges into the deep sub-micron regime, e.g., below about 0.3 micron and under, e.g., about 0.2 micron and under.

In accordance with embodiments of the present invention, silicon carbide is strategically employed as a combined middle etch stop layer/ARC in implementing dual damascene techniques, particularly via-first trench-last dual damascene techniques. Silicon carbide can be deposited, as by chemical vapor deposition, such that it exhibits an extinction coefficient (k) of about −0.10 to about −0.60, by chemical vapor deposition.

Advantageously, the use of silicon carbide as a middle etch stop layer/ARC exhibiting superior anti-reflective properties vis-à-vis conventional silicon nitride or silicon oxynitride middle etch stop layers, enables a significant reduction in the thickness of the photoresist mask employed when patterning the trench, thereby improving the dimensional accuracy of the resulting metal line. For example, in accordance with embodiments of the present invention, the photoresist mask employed to form the trench can be formed at a reduced thickness of about 2,500 Å to about 3,500 Å, e.g., about 3,000 Å. In addition, the superior anti-reflective properties of silicon carbide render it unnecessary to employ an organic BARC as conventionally formed below the first dielectric layer, such that the first dielectric layer can be formed directly on the underlying capping layer of the lower patterned metal level, thereby improving efficiency and reducing manufacturing costs.

In accordance with embodiments of the present invention, the resulting dual damascene structure can be filled with any suitable metal, such as Cu. In implementing Cu damascene methodology, a barrier layer and seedlayer are typically sequentially deposited prior to depositing Cu, as by electrodeposition or electroless deposition. CMP is then typically conducted such that the upper surface of the filled trench is substantially coplanar with the upper surface of the second dielectric layer. A capping layer, such as silicon nitride, is then typically deposited. Advantageously, the use of silicon carbide as a middle etch stop layer/ARC improves dimensional accuracy by about 50% or more vis-à-vis the use of silicon oxynitride as a middle etch stop layer. The silicon carbide metal etch stop layer/ARC of the present invention can be deposited at a suitable thickness, such as about 200 Å to about 800 Å.

Figure 2:
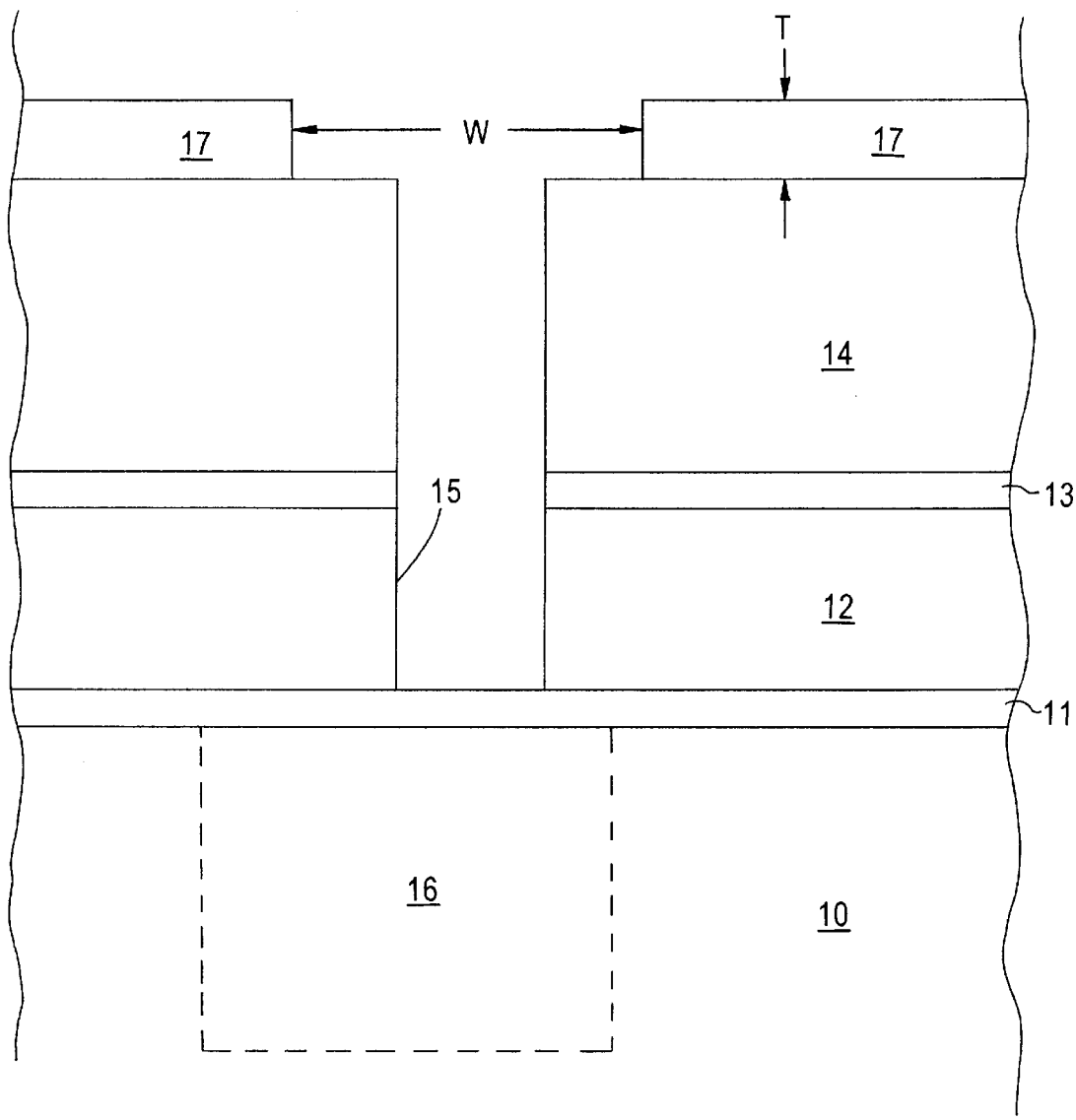
Figure 3:
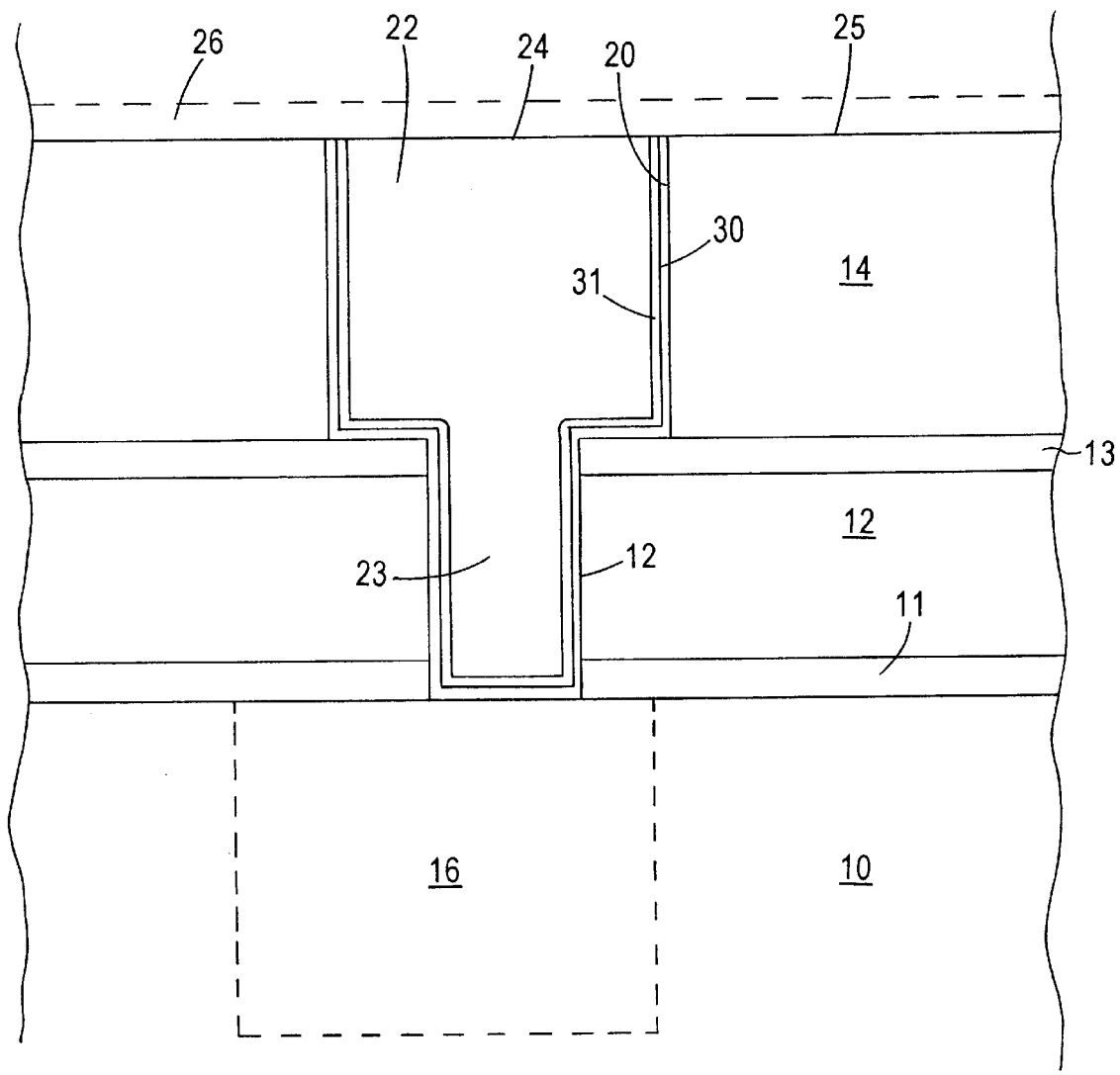

An embodiment of the present invention is schematically illustrated in FIGS. 1 through 3. Adverting to FIG. 1, a first dielectric layer 12, e.g., an ILD, is formed over an underlying layer 10 having a metal feature 16, such as an underlying metal line, e.g., Cu, and a capping layer 11, such as silicon nitride, thereon. A silicon carbide middle etch stop layer/ARC 13, having an extinction coefficient of about −0.10 to about −0.60, is then deposited on first dielectric layer 12 at a suitable thickness, such as about 200 Å to about 800 Å, e.g., about 500 Å. Subsequently, dielectric layer 14, such as a silicon oxide ILD, is deposited on silicon carbide layer 13. Via opening 15 is then formed in a conventional manner, as by forming a photoresist mask over dielectric layer 14 and anisotropically etching. The etch chemistry employed is such that there is virtually no selectivity between the etched layers. Via opening 15 is formed through second dielectric layer 14, silicon carbide layer 13 and first dielectric layer 12 stopping on capping layer 11.

Subsequently, as shown in FIG. 2, a photoresist mask 17 is formed on second dielectric layer 14 with an opening therein W defining the width of the subsequently formed trench which is larger than the cross-sectional width of via opening 15. Advantageously, photoresist mask 17 can be formed at a considerably reduced thickness T, such as about 2,500 Å to about 3,500 Å, e.g., about 3,000 Å, considerable less than the 4,000 Å to 6,000 Å thick conventional silicon oxynitride middle etch stop layer.

Subsequently, adverting to FIG. 3, trench opening 20 is formed through second dielectric layer 14 stopping on silicon carbide middle etch stop layer/ARC and in communication with via opening 15. During etching, a portion of capping layer 11 is removed exposing a portion of metal layer 16. The use of silicon carbide layer 50 having a desirable extinction coefficient (k), e.g., about −0.10 to about −0.60, enables the formation of trench opening 20 with accurately formed vertical side surfaces vis-a-vis conventional practices employing a silicon oxynitride etch stop layer. Subsequently, processing is conducted in a conventional manner, as by depositing metal 22 filling the via opening 50 and trench 20, forming an overburden (not shown), and then conducting CMP such that the upper surface 24 of metal line 22 is substantially coplanar with the upper surface 25 of second dielectric layer 14. A capping layer 23 (shown in phantom), typically silicon nitride is then deposited to encapsulate the inlaid Cu metallization. In depositing Cu to form via 23 and line 22 as by electrodeposition or electroless deposition, a barrier metal 30 is typically initially deposited to line the dual damascene opening, and a seedlayer 31 deposited thereon. Typical barrier metal layers include Ta and TaN, while typical seedlayers include alloys of copper with elements such as magnesium, aluminum, zinc, zirconium, tin, nickel, palladium, gold or silver, in suitable amounts, e.g., about 0.3 to about 12 at. %.

The present invention advantageously enables the fabrication of damascene structures in the deep sub-micron regime, e.g., metal lines having a width of about 0.3 micron or under, e.g., about 0.2 micron and under, including Cu lines, particularly employing via-first trench-last dual damascene techniques. In implementing embodiments of the present invention, various metals and various dielectric materials can be employed. Suitable dielectric materials for ILDs include various forms of silicon oxide as well as low dielectric constant materials, such as polymers and various organic, carbon-containing materials having a dielectric constant less than about 4, e.g., less than about 3.

The present invention enjoys industrial applicability in manufacturing various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising sequentially:

forming a first dielectric layer on a capping layer overlaying a lower metal feature of a lower metal level;

forming a silicon carbide etch stop layer/anti-reflective coating (ARC) on the first dielectric layer;

forming a second dielectric layer on the silicon carbide etch stop layer/ARC;

etching to form a first opening, having a cross-sectional width, through the second dialectic layer, through the silicon carbide etch stop layer/ARC and through the first dielectric layer exposing a portion of the capping layer;

forming a photoresist mask on the second dielectric layer; and etching to form a second opening, having a width greater than the cross-sectional width of the first opening, through the second dielectric layer stopping on the silicon carbide etch stop layer/ARC, and etching through the exposed portion of the capping layer exposing a portion of the lower metal feature; wherein the first opening constitutes a via opening and the second opening constitutes a trench.

2. The method according to claim 1, comprising forming the photoresist mask at a thickness of about 2,500 Å to about 3,500 Å.

3. The method according to claim 2, comprising forming the photoresist mask at a thickness of about 3,000 Å.

4. The method according to claim 1, wherein the capping layer comprises silicon nitride, the method comprising forming the first dielectric layer directly on the silicon nitride capping layer.

5. The method according to claim 1, comprising filling the via opening and trench with a metal to form a via in contact with a metal line.

6. The method according to claim 5, comprising filling the via opening and trench with copper (Cu) or a Cu alloy.

7. The method according to claim 5, comprising depositing a barrier metal layer to line the via and trench before depositing the Cu or Cu alloy to fill the via opening and trench.

8. The method according to claim 7, comprising sequentially:
   depositing a seedlayer on the barrier metal layer; and
   depositing the Cu or Cu alloy by electrodeposition or electroless deposition to fill the via and trench opening.

9. The method according to claim 1, comprising forming the silicon carbide etch stop layer/ARC at a thickness of about 200 Å to about 800 Å.

10. The method according to claim 1, comprising depositing the silicon carbide etch stop layer/ARC with an extinction coefficient (k) of about −0.10 to about −0.60.

* * * * *